United States Patent
Uemura et al.

(10) Patent No.: US 9,530,896 B2
(45) Date of Patent: Dec. 27, 2016

(54) DISPLAY DEVICE USING AN OXIDE SEMICONDUCTOR

(71) Applicant: Japan Display Inc., Minato-ku (JP)

(72) Inventors: Norihiro Uemura, Tokyo (JP); Isao Suzumura, Tokyo (JP); Hidekazu Miyake, Tokyo (JP); Yohei Yamaguchi, Tokyo (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 14/658,430

(22) Filed: Mar. 16, 2015

(65) Prior Publication Data
US 2015/0263048 A1    Sep. 17, 2015

(30) Foreign Application Priority Data
Mar. 17, 2014   (JP) .................. 2014-053604

(51) Int. Cl.
| H01L 29/10 | (2006.01) |
| H01L 29/786 | (2006.01) |
| H01L 29/417 | (2006.01) |

(52) U.S. Cl.
CPC ..... *H01L 29/7869* (2013.01); *H01L 29/41733* (2013.01)

(58) Field of Classification Search
CPC ........... H01L 27/12; H01L 51/56; H01L 27/32
USPC .......................... 257/40, 43; 438/30, 46, 104
See application file for complete search history.

(56) References Cited

U.S. PATENT DOCUMENTS

| 8,158,466 B2 | 4/2012 | Kim et al. | |
| 8,502,229 B2 | 8/2013 | Kim et al. | |
| 2010/0176388 A1 | 7/2010 | Ha et al. | |
| 2011/0003418 A1* | 1/2011 | Sakata | H01L 21/02554 438/34 |
| 2011/0037068 A1* | 2/2011 | Yamazaki | H01L 27/1225 257/43 |
| 2011/0057186 A1* | 3/2011 | Yamazaki | H01L 27/1225 257/43 |
| 2011/0227060 A1* | 9/2011 | Miyanaga | H01L 29/7869 257/43 |

(Continued)

FOREIGN PATENT DOCUMENTS

| JP | 2010-161373 | 7/2010 |
| JP | 2010-283326 | 12/2010 |

(Continued)

*Primary Examiner* — Caleb Henry
(74) *Attorney, Agent, or Firm* — Oblon, McClelland, Maier & Neustadt, L.L.P.

(57) ABSTRACT

Provided are a reliable high performance thin film transistor and a reliable high performance display device. The display device has: a gate electrode which is formed on a substrate; a gate insulating film which is formed to cover the substrate and the gate electrode; an oxide semiconductor layer which is formed on the gate electrode through the gate insulating film; a channel protective layer which is in contact with the oxide semiconductor layer and formed on the oxide semiconductor layer; and source/drain electrodes which are electrically connected to the oxide semiconductor layer and formed to cover the oxide semiconductor layer. A metal oxide layer is formed on an upper part of the channel protective layer. The source/drain electrodes are formed to be divided apart on the channel protective layer and the metal oxide layer.

20 Claims, 6 Drawing Sheets

(56) References Cited

U.S. PATENT DOCUMENTS

2013/0037799 A1* 2/2013 Sakata .............. H01L 21/02554
257/43
2013/0082252 A1* 4/2013 Yamazaki ......... H01L 29/66969
257/43

FOREIGN PATENT DOCUMENTS

| JP | 5129228 | 1/2013 |
| JP | 5399274 | 1/2014 |

\* cited by examiner

DISPLAY DEVICE USING AN OXIDE SEMICONDUCTOR

CLAIM OF PRIORITY

The present application claims priority from Japanese patent application JP2014-053604 filed on Mar. 17, 2014, the content of which is hereby incorporated by reference into this application.

BACKGROUND

The present invention relates to a display device and a manufacturing method thereof, and, more particularly, to a display device using an oxide semiconductor and a manufacturing method thereof.

In general, amorphous silicon thin film transistors (hereinafter referred to as amorphous Si-TFTs; Thin-Film-Transistors) are used as driving elements for the liquid crystal panel. The amorphous Si-TFT has excellent switching characteristics. The liquid crystal panel driven thereby has a wide variety of uses in a range from small-sized displays (mobile phones or digital cameras) to large-sized liquid crystal displays for televisions of over 30 inches. The amorphous Si-TFT has a low level of mobility as an index representing the movement of electrons, specifically, approximately 0.5 $cm^2/Vs$. On the contrary, its manufacturing processes are relatively short, and it can be manufactured for a large-sized substrate. This enables the wide variety of uses, from the small-sized to large-sized displays.

The inventors of the present application have developed an oxide TFT using an oxide semiconductor layer, as a high performance thin film transistor (TFT) having higher mobility than that of the amorphous Si-TFT, and have developed processes for manufacturing the oxide TFT in accordance with substantially the same processes as those for the amorphous Si-TFT. The oxide TFT has a channel protective layer on the upper part of the semiconductor layer, resulting in high mobility. This realizes a high reliable TFT.

The important subject in the oxide TFT is realization of the high reliable TFT. A problem may occur that the degradation of the TFT accelerates upon entrance of external light toward the oxide semiconductor layer. That is, a problem is that a variation in the threshold voltage due to a voltage stress to the TFT accelerates upon light irradiation toward the oxide semiconductor layer. This variation in the threshold voltage may cause a trouble in image display, when it happens in the TFTs applied in pixels or TFTs applied in peripheral circuits.

Japanese Unexamined Patent Publication No. 2010-161373 discloses a technique for forming a protective layer including titanium oxide or titanium oxynitride, using a direct current reactive sputtering method. When an attempt is made to form the protective film using this sputtering method, it needs to have a thickness sufficiently enough to effectively function, thus causing a problem of decreasing manufacture throughput.

Japanese Unexamined Patent Publication No. 2010-283326 discloses a technique for forming oxide titanium, by performing an oxidation process, after formation of a pattern including titanium or titanium alloys on the upper part of the oxide semiconductor layer. When to form a titanium oxide film on the oxide semiconductor layer, oxygen in the oxide semiconductor layer is absorbed and lost in the process of oxidizing titanium or titanium alloys, thus resulting in difficulty in obtaining preferable characteristics.

It is difficult to sufficiently prevent the degradation of the TFT due to light entrance toward the semiconductor layer, in accordance with the techniques of Japanese Unexamined Patent Publications No. 2010-161373 and No. 2010-283326.

SUMMARY

The present invention has been made in consideration of the above problem. It is accordingly an object of the present invention to provide a high performance thin film transistor having excellent reliability and a reliable high performance display device using it.

Another object thereof is to provide a method for manufacturing a thin film transistor having excellent reliability and a method for manufacturing a reliable high performance display device.

In order to solve the above objects, according to an aspect of the present invention, there is provided a display device having: a gate electrode which is formed on a substrate; a gate insulating film which is formed to cover the substrate and the gate electrode; an oxide semiconductor layer which is formed on the gate electrode through the gate insulating film; a channel protective layer which is in contact with the oxide semiconductor layer and formed on the oxide semiconductor layer; and source/drain electrodes which are electrically connected to the oxide semiconductor layer and formed to cover the oxide semiconductor layer, and wherein a metal oxide layer is formed on an upper part of the channel protective layer, and the source/drain electrodes are formed to be divided apart on the channel protective layer and the metal oxide layer.

According to another aspect of the present invention, there is provided a display device having: a gate electrode which is formed on a substrate; a gate insulating film which is formed to cover the substrate and the gate electrode; an oxide semiconductor layer which is formed on the gate electrode through the gate insulating film; an etching stopper layer which is formed with a silicon oxide film formed to cover the oxide semiconductor layer; and source/drain electrodes which are electrically connected to the oxide semiconductor layer through a plurality of contacts formed in the etching stopper layer, and are formed to cover the oxide semiconductor layer, and wherein the source/drain electrodes are formed to be divided apart on the etching stopper layer, and a metal oxide layer is formed on an upper part of the etching stopper layer in a divided region.

According to still another aspect of the present invention, there is provided a method of manufacturing a display device, including: (a) a step of forming a first metal film on a substrate to form a gate electrode by patterning the film; (b) a step of forming a gate insulating film on the substrate and the gate electrode to cover the substrate and the gate electrode; (c) a step of forming a semiconductor oxide film on the gate insulating film to form an oxide semiconductor layer by patterning the film; (d) a step of forming a silicon oxide film on the gate insulating film and the oxide semiconductor layer to form a channel protective layer on the oxide semiconductor layer by patterning the film; (e) a step of forming a second metal film, a third metal film, and a fourth metal film in order of lower layer, as source/drain electrodes, to cover the gate insulating film, the oxide semiconductor layer, and the channel protective layer, and removing the third metal film and the fourth metal film on the channel protective layer by patterning the films to expose the second metal film; and (f) a step of performing an oxidation process on a surface of the substrate to form a metal oxide layer in a region where the second metal film is exposed.

DESCRIPTION OF THE PREFERRED EMBODIMENTS

Figure 1:
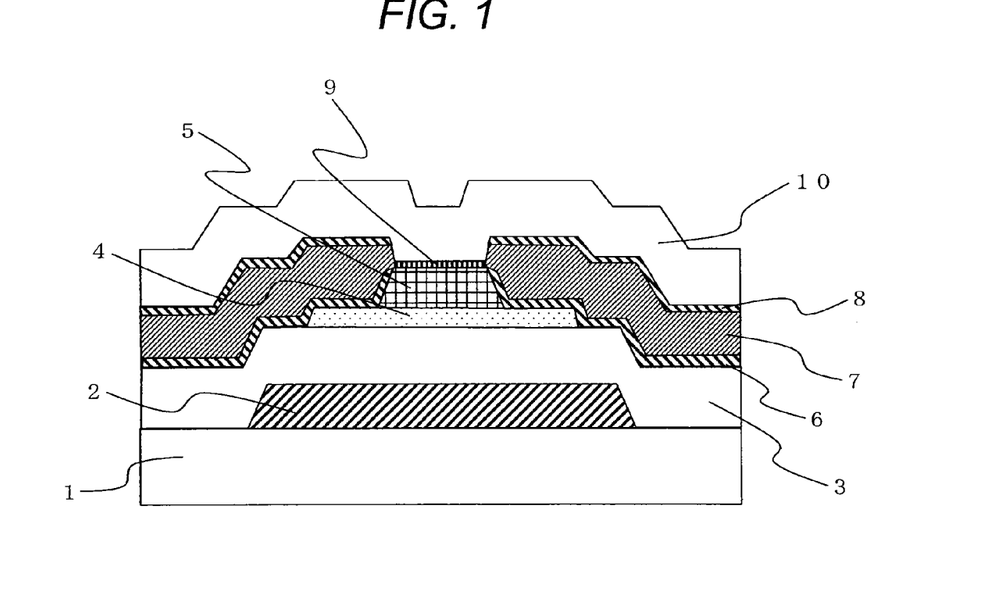
FIG. 1 is a diagram illustrating a partial cross section of a display device according to an embodiment of the present invention.
Figure 2:
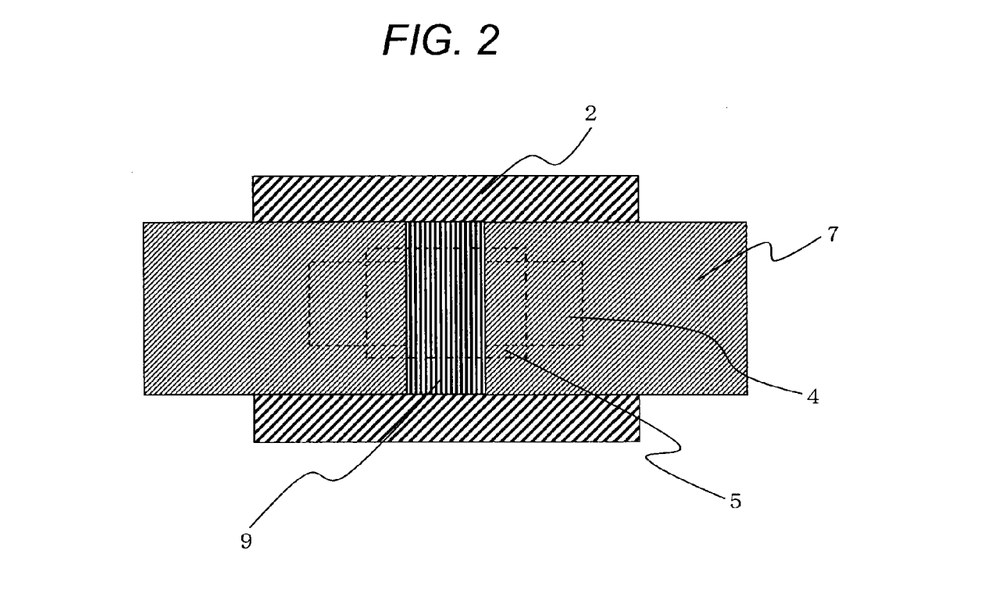
FIG. 2 is a diagram illustrating a partial cross section of a display device according to an embodiment of the present invention.

Descriptions will now be made to preferred embodiments of the present invention with reference to the drawings. The disclosure is made only by way of example, and those modifications that can easily be devised by the skilled in the art with maintaining the purpose of the present invention are included in the scope of the present invention. To clarify the descriptions, the illustrations may schematically be made in width, thickness, and shape of each unit, as compared with the actual appearance. However, these illustrations are made by way of example, and are not to limit the interpretation of the present invention. In this specification and the illustrations, the same reference numeral is given to the same elements described in the afore-mentioned illustration, and the specific description will not repeatedly be made thereto.
First Embodiment FIG. 1 and FIG. 2 schematically illustrate an example of a thin film transistor (TFT) according to an embodiment of the present invention. FIG. 1 is a cross section of the TFT, and FIG. 2 is a plan view of the TFT, and these illustrate a bottom-gate transistor structure.

A gate electrode 2 is formed on a glass substrate 1, and a gate insulating film 3 is formed to cover the glass substrate 1 and the gate electrode 2. An oxide semiconductor layer 4 is formed on the gate insulating film 3. For easy understanding of the scheme of the TFT structure, the gate insulating film 3 is not illustrated in FIG. 2, and the oxide semiconductor layer 4 is formed in the area of the dashed line.

Further, a channel protective layer 5 is formed in contact with the oxide semiconductor layer 4 on the upper part of an oxide semiconductor channel unit. Source/drain electrodes A6, source/drain electrodes B7, and source/drain electrodes C8 are formed, sequentially in the order of lower layer, to cover the oxide semiconductor layer 4 and the channel protective layer 5, and are in electrical connection with the oxide semiconductor layer 4. In FIG. 1, the source/drain electrodes show no distinction between the source electrode and the drain electrode. In FIG. 2, the source/drain electrodes C8 are not illustrated, and the channel protective layer 5 is illustrated with long dashed short dashed lines.

A metal oxide layer 9 is formed in succession with the source/drain electrodes A6, on the upper part of the channel protective layer 5. A passivation layer 10 is formed to cover the metal oxide layer 9 and the source/drain electrodes C8. In FIG. 2, this passivation layer 10 is not illustrated.

The gate insulating film 3 is formed with a silicon oxide film, a silicon nitride film, or a silicon oxynitride film. The gate insulating film 3 may have a layered structure, or may have a structure with a combination of any of the above insulating films. In this case, the layer in contact with the oxide semiconductor layer 4 is a silicon oxide film. The thickness of the gate insulating film 3 is in a range from 80 nm to 2000 nm, and may have an appropriate thickness in consideration of the withstand voltage or capacity.

The gate electrode 2, the source/drain electrodes A6, the source/drain electrodes B7, and the source/drain electrodes C8 are formed with an element of or an alloy in combination with aluminum (Al), molybdenum (Mo), chromium (Cr), copper (Cu), tungsten (W), titanium (Ti), zirconium (Zr), tantalum (Ta), silver (Ag), and manganese (Mn). They may have a layered structure in which aluminum is layered on titanium, or titanium is sandwiched between an upper and lower aluminum layers. The oxide semiconductor layer 4 is an In—Ga—Zn—O based oxide semiconductor, formed with the elements as the main component, of indium (In), gallium (Ga), zinc (Zn), and oxygen (O). Other than this, it may be any of an In—Al—Zn—O based oxide semiconductor, an In—Sn—Zn—O based oxide semiconductor, an In—Zn—O based oxide semiconductor, an In—Sn—O based oxide semiconductor, a Zn—O based oxide semiconductor, and an Sn—O based oxide semiconductor. The thickness of the oxide semiconductor layer 4 is made in a range from 30 nm to 500 nm. It may be adjusted in accordance with the use of the layer. For example, the layer is made thick, when it is used for a device requiring a large current.

The channel protective layer 5 is formed with a silicon oxide layer. Further, the metal oxide layer 9 is formed by performing an oxidation process for metal, in contact with the source/drain electrodes A6, and arranged therebetween. That is, the metal oxide layer 9 is formed on the upper part of the channel protective layer 5, while the source/drain electrodes A6, the source/drain electrodes B7, and the source/drain electrodes C8 are formed to be divided apart on the channel protective layer 5 and the metal oxide layer 9. The channel protective layer 5 protects the oxide semiconductor layer 4 at the processing of the source/drain electrodes, and, at the same time, has a role to prevent mixing of impurities externally into the oxide semiconductor layer 4. Thus, the thickness is preferably thick enough therefor. In this embodiment, the thickness is 400 nm.

The passivation layer 10 is formed with an insulating film of a silicon oxide film, a silicon nitride film, or a silicon oxynitride film. The passivation layer 10 may have a layered structure, or may have a structure in combination any of the above-described insulating films.

Figure 6:
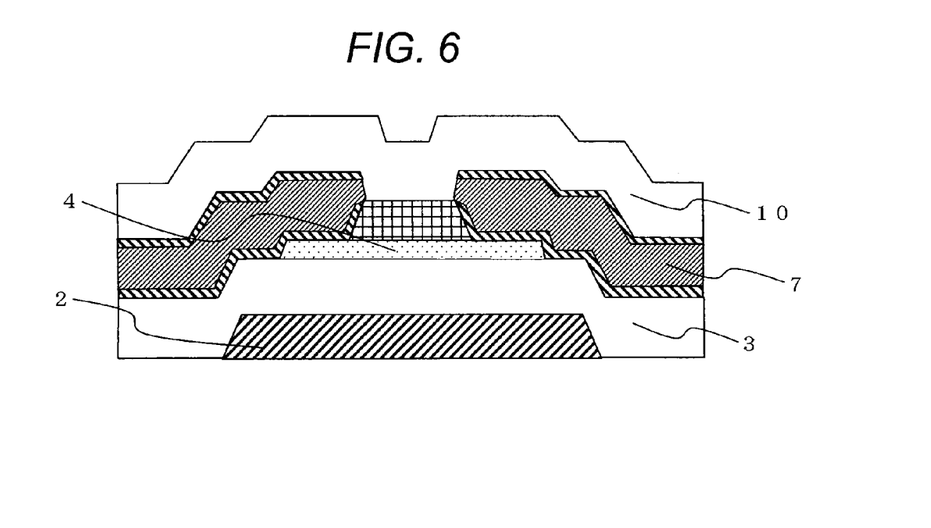
FIG. 6 is a diagram illustrating a partial cross section of a conventional display device.
Figure 7:
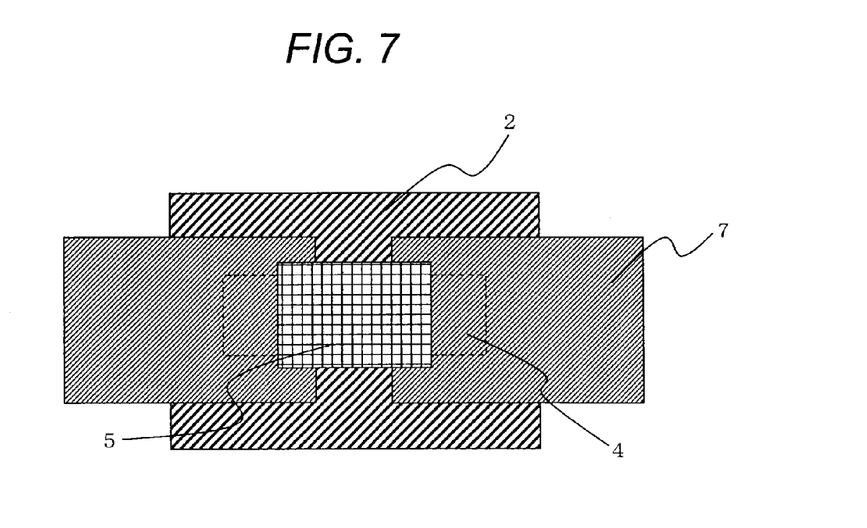
FIG. 7 is a diagram illustrating a partial cross section of a conventional display device.

FIG. 6 and FIG. 7 illustrate an example of a conventional TFT structure. In the conventional TFT structure, the metal oxide layer 9 is not formed on the upper part of the channel protective layer.

Figure 3A:
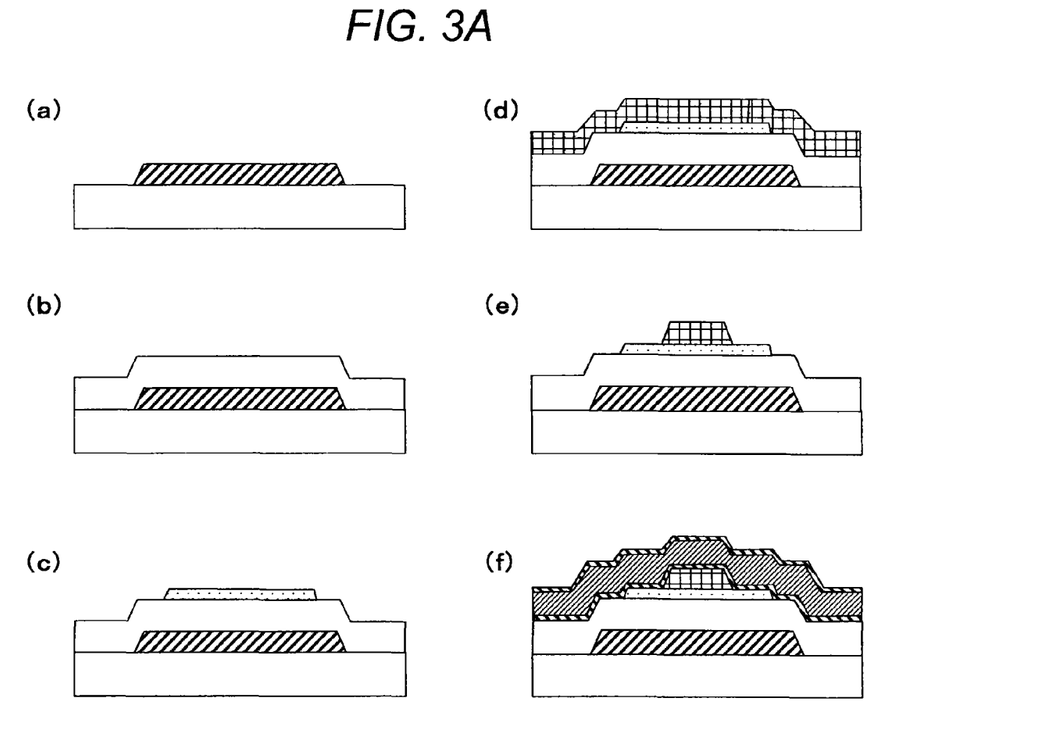
FIG. 3A is a cross section illustrating a manufacturing process for the display device according to an embodiment of the present invention.
Figure 3B:
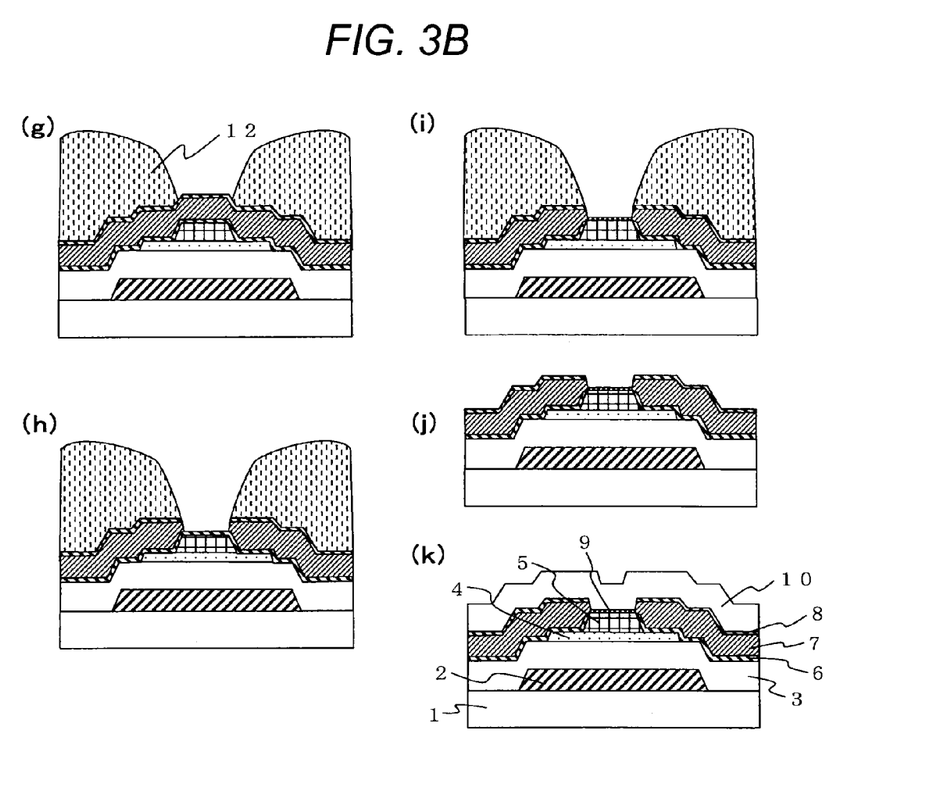
FIG. 3B is a cross section illustrating a manufacturing process for the display device according to an embodiment of the present invention.

Descriptions will now be made to an example of a manufacturing process for a liquid crystal display device in this embodiment, using FIG. 3A and FIG. 3B. In FIG. 3A and FIG. 3B, the manufacturing process will be explained using a cross sectional structure of the TFT.

As illustrated in FIG. 3A and FIG. 3B, the manufacturing process for the liquid crystal display device in this embodiment includes formation of a gate electrode, formation of a gate insulating film, formation of a semiconductor layer, formation of a channel protective layer, formation of a source/drain electrode layer, formation of a metal oxide layer, and formation of a protective layer.

The gate electrode 2 is a metal conductive film, such as a molybdenum film, a tungsten film, and an aluminum film, formed using a sputtering technique on, for example, a glass substrate 1. Subsequently, after application of a photosensitive resin film onto the metal conductive film, it is developed and patterned, thereby forming a resist pattern. After the metal conductive film exposed from the resist pattern is removed by wet etching or dry etching, the resist pattern is detached therefrom, to form the gate electrode 2 on the glass substrate 1 (process a). The gate electrode 2 is formed on the glass substrate 1. Alternatively, a silicon nitride film may be formed on the glass substrate 1 to prevent mixing of alkali ion from the glass substrate 1, and then the gate electrode 2 may be formed thereon. That is, a silicon nitride film may be formed between the glass substrate 1 and the gate electrode 2, for prevention of direction contact between the glass substrate 1 and the gate electrode 2. A flexible substrate that can withstand the thermal process of the TFT may be used in place of the glass substrate 1.

The gate insulating film 3 is formed by forming a silicon oxide film, a silicon nitride film, and a silicon oxynitride film using a plasma CVD (Chemical-Vapor-Deposition) technique, on the glass substrate 1 where the gate electrode 2 is formed (process b).

The oxide semiconductor layer 4 is formed as any of an In—Ga—Zn—O based oxide semiconductor, an In—Al—Zn—O based oxide semiconductor, an In—Sn—Zn—O based oxide semiconductor, an In—Zn—O based oxide semiconductor, an In—Sn—O based oxide semiconductor, a Zn—O based oxide semiconductor, and an Sn—O based oxide semiconductor, on the glass substrate 1 where the gate insulating film 3 is formed. Subsequently, after application of a photosensitive resin film onto the oxide semiconductor, it is developed and patterned, thereby forming a resist pattern. After the oxide semiconductor exposed from the resist pattern is removed therefrom by wet etching, the resist pattern is detached therefrom, to form the oxide semiconductor layer 4. A plasma treatment process is performed on the oxide semiconductor layer 4, using oxygen ($O_2$) or dinitrogen oxide ($N_2O$), thereby forming the oxide semiconductor layer 4 with very few oxygen defects (process c).

The channel protective layer 5 is formed as a silicon oxide film using a plasma CVD technique on the glass substrate 1 where the oxide semiconductor layer 4 is formed. After application of a photosensitive resin film onto the channel protective layer 5, it is developed and patterned, thereby forming a resist pattern. After the channel protective layer 5 exposed from the resist pattern is removed therefrom by dry etching, the resist pattern is detached therefrom (process d, process e).

Though not illustrated, before forming the source/drain electrodes, a contact hole for the gate electrode may be formed.

The source/drain electrodes are formed using a sputtering technique, on the glass substrate 1 where the channel protective layer 5 and the oxide semiconductor layer 4 are formed. The source/drain electrodes A6 are formed, the source/drain electrodes B7 are formed to cover this, and then the source/drain electrodes C8 are formed to cover these, sequentially in the order of lower layer. The source/drain electrodes A6 includes, for example, titanium (Ti). The source/drain electrodes B7 includes high conductive metal, for example, aluminum (Al), copper (Cu), or silver (Ag). Further, the source/drain electrodes C8 includes, for example, titanium (Ti) or molybdenum (Mo) (process f).

Subsequently, after application of a photosensitive resin film onto the source/drain electrodes C8, it is developed and patterned, thereby forming a resist pattern 12. Then, the source/drain electrodes C8 and the source/drain electrodes B7 exposed from the resist pattern are removed therefrom by wet etching or dry etching, while the source/drain electrodes A6 remain as are without being etched. In consideration of the etching variation or process variation in the surface of the glass substrate 1, the source/drain electrodes B7 may remain without entirely being etched, or the source/drain electrodes A6 may only slightly be etched (process g, process h).

The metal oxide layer 9 is formed by performing an oxidation process on the surface of the glass substrate 1, that is, an oxidation process (oxygen plasma treatment process) for a part of the source/drain electrodes A6 which is exposed from the resist pattern 12. When the source/drain electrodes B7 remain, an oxidation process is performed for both of the source/drain electrodes A6 and the source/drain electrodes B7, thereby forming the metal oxide layer 9 (process i).

Other than the oxygen plasma treatment process, titanium may be oxidized by performing a plasma treatment process using dinitrogen oxide ($N_2O$) or a thermal process in an oxidation atmosphere. After the formation of the metal oxide layer 9, the resist pattern 12 is detached (process j). In this manner, by forming the metal oxide layer 9, it is possible to prevent the light entrance to the oxide semiconductor layer 4 and to prevent a shift in the threshold voltage. That is, the metal oxide layer 9 functions as a light shielding layer for shielding the entrance of external light to the oxide semiconductor layer 4. The thickness of the metal oxide layer 9 is in a range from 50 nm to 200 nm. This enables to attain preferable electric characteristics of a region as the source/drain electrodes A6 without being oxidized and preferable shielding characteristics of a region to be oxidized as the metal oxide layer 9.

The passivation layer 10 is formed by performing a plasma CVD technique for an insulating film, such as a silicon oxide film, a silicon nitride film, and a silicon oxynitride film (process k). After this, though not illustrated, a contact hole for the source electrode and the drain electrode is formed.

Though not illustrated, subsequent processes for manufacturing the display device are as follows. An organic flattening film is formed by applying and baking acrylic polymer materials. Then, it is developed and exposed, and a pattern for the contact hole is formed.

A first transparent electrode layer is formed as any of an In—Sn—O based oxide layer, an In—Zn—O based oxide layer, a Zn—O based oxide layer, using a sputtering technique. After application of a photosensitive resin film on an oxide layer, it is developed and patterned, thereby forming a resist pattern. After this, the first transparent electrode layer is stabilized by a baking process.

An interlayer capacity film is formed by performing a plasma CVD technique for an insulating film, such as a silicon nitride film or a silicon oxynitride film. After application of a photosensitive resist film onto the interlayer capacity film, it is developed and patterned, thereby forming a resist pattern. The interlayer capacity film and the protective film exposed from the resist pattern are removed therefrom by dry etching. After this, the resist pattern is detached therefrom, and a contact hole is formed.

A second transparent electrode layer is formed as any of an In—Sn—O based oxide layer, an In—Zn—O based oxide layer, or a Zn—O based oxide layer, using a sputtering technique in contact with the source electrode formed with a metal film. Subsequently, after application of a photosensitive resin film onto the oxide layer, it is developed and patterned, thereby forming a resist pattern. After this, the second transparent electrode layer is stabilized by a baking process.

Descriptions will now be made to optical degradation of an oxide TFT. The band gap of, for example, an In—Ga—Zn—O based oxide semiconductor is approximately in a range from 3 to 3.2 eV, and visible light is hardly absorbed. However, if a defect level exists, the visible light is slightly absorbed. Positive vacancies are generated in the sub-band gap, and holes are generated by optical excitation and trapped in an insulating film interface, thereby causing a shift in the threshold voltage. Alternatively, light excites electrons, the level is changed to a shallow level due to the lattice relaxation, that is, it will be a donor. This causes a Vth shift. As a result, optical irradiation accelerates a variation in the threshold voltage due to a voltage stress of the TFT.

Descriptions will now be made to evaluation results of reliability between a TFT with this embodiment applied therein and a conventional TFT. A liquid crystal panel is formed, and an image display device is formed with a driver implemented therein. This is evaluated through an acceleration test by high temperature electrification. In the electrification method, 250 gradation levels for white, 250 gradation levels for red, 255 gradation levels for green, and 250 gradation levels for blue are displayed sequentially for 60 seconds each. It is performed at a maintained temperature of 85° C. using a thermostat.

The evaluation is attained up to 500 hours, and the threshold voltage is examined in the middle of the evaluation at the stages of 1, 2, 4, 8, 24, 48, 96, 168, and 240 hours. The results are illustrated in FIG. 4.

Figure 4:
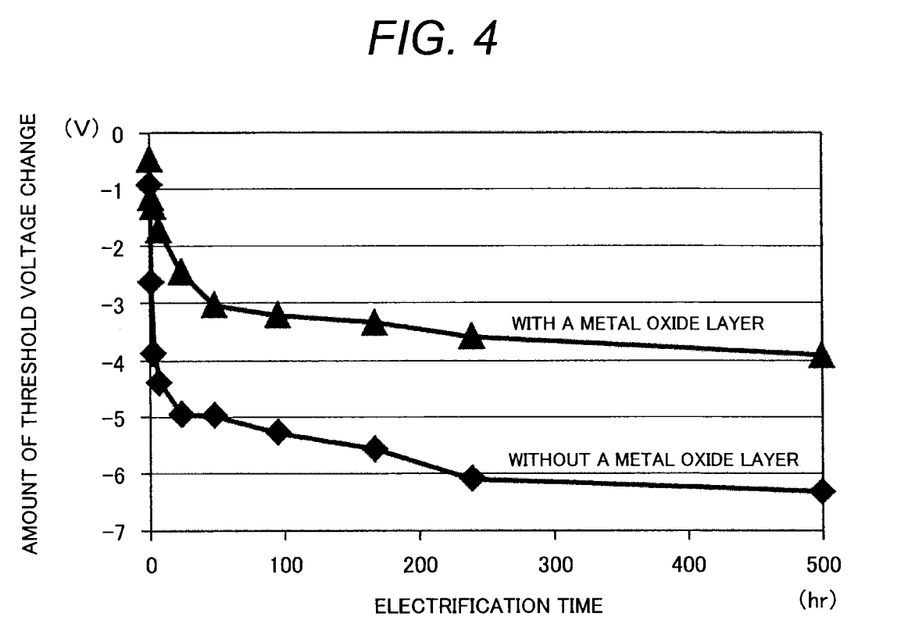
FIG. 4 is a diagram illustrating threshold voltage characteristics of the display device according to an embodiment of the present invention.

FIG. 4 illustrates both evaluation results of the present invention (with a metal oxide layer) and a conventional structure (without a metal oxide layer). In the conventional structure (without a metal oxide layer), the threshold voltage changes by −6.3 in the evaluation of 500 hours. On the other hand, in the present invention (with a metal oxide layer), the threshold voltage changes by −3.9, that is, the shift amount of the threshold voltage is suppressed down to 62%. This is because the light entering the semiconductor layer is reduced by the metal oxide layer.

As illustrated in FIG. 1, this embodiment has a bottom gate structure, and an opaque gate electrode exists between the semiconductor layer and the backlight. Thus, light from the backlight does not directly enter the semiconductor layer. However, after the light from the backlight is slightly reflected from the black matrix or a color filter of a color filter substrate, the light enters the semiconductor layer. It may possibly cause a variation in the threshold voltage.

As a method for suppressing this reflection from the color filter substrate, there is a method for reducing the light entrance to the color filter near the semiconductor layer and reducing the reflected light, by the formation of the gate electrode wide enough to cover the semiconductor layer. However, if the gate electrode is widely formed, a problem occurs in that the pixel aperture ratio decreases and the luminance also decreases.

Therefore, if the present invention is applied, it is possible to realize a liquid crystal display device, causing a variation in the threshold voltage with high reliability and a high aperture ratio. Due to the high aperture ratio, it is possible to realize a liquid crystal display device that can reduce electricity for the backlight, thus implementing low power consumption while maintaining the luminance.

Second Embodiment

Figure 5A:
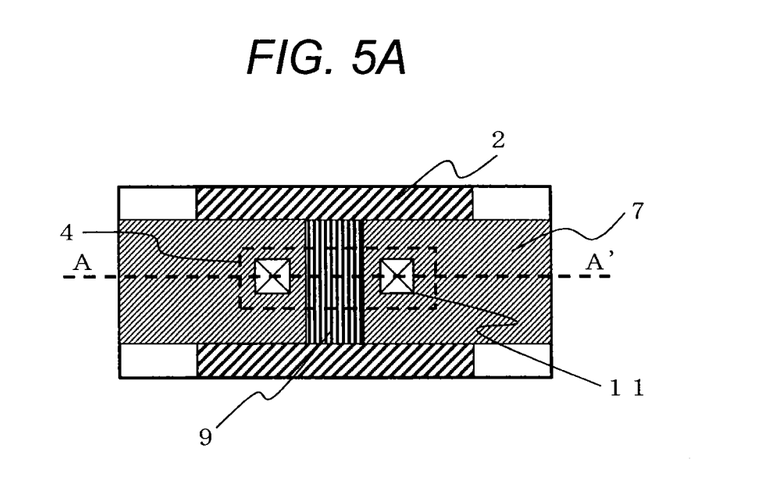
FIG. 5A is a diagram illustrating a partial plan view of the display device according to an embodiment of the present invention.
Figure 5B:
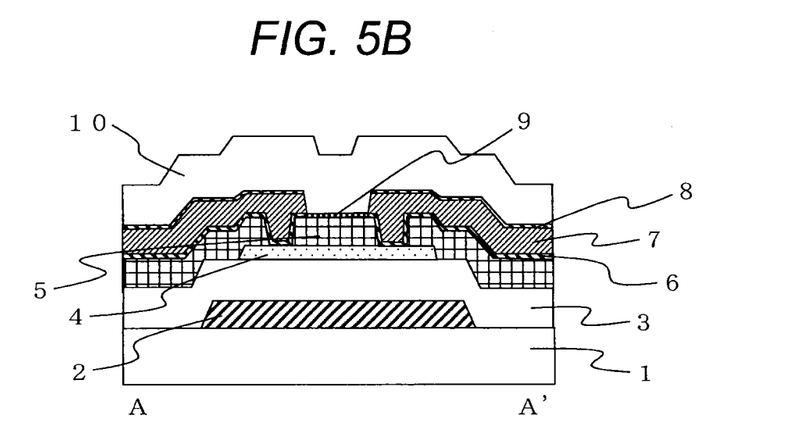
FIG. 5B is a diagram illustrating a partial cross section of the display device according to an embodiment of the present invention.

FIG. 5A and FIG. 5B schematically illustrate an example of a thin film transistor (TFT) according to another embodiment of the present invention. FIG. 5A is a plan view of a TFT, while FIG. 5B is a cross section of A-A' in FIG. 5A, that is, a cross section of the TFT, and illustrate a bottom-gate transistor structure, like the first embodiment. In the second embodiment, the structures and reference numerals that are common to those of the first embodiment will briefly be described without specific descriptions.

FIG. 5A and FIG. 5B illustrate the structure with an etching stopper layer on the same layer as the channel protective layer 5. The etching stopper layer is formed to cover the oxide semiconductor layer 4. The etching stopper layer includes a plurality of contact holes 11 for forming contacts for electrically connecting the oxide semiconductor layer 4 and the source electrodes and the drain electrodes, that is, the source/drain electrodes A6, the source/drain electrodes B7, and the source/drain electrodes C8.

As illustrated in FIG. 5A and FIG. 5B, the metal oxide layer 9 is in contact with the source/drain electrodes A6, and is arranged therebetween. That is, the metal oxide layer 9 is formed on the upper part of the channel protecting layer 5. The source/drain electrodes A6, the source/drain electrodes B7, the source/drain electrodes C8 are formed to be divided apart on the etching stopper layer. The metal oxide layer 9 is formed on the etching stopper layer corresponding to the divided region, that is, on the upper part of the channel protecting layer 5.

The basic manufacturing process is the same as that of the first embodiment. In the TFT structure of the first embodiment, the source/drain electrodes are in contact with the semiconductor layer on its top and side. In the second embodiment, the etching stopper layer has the contact holes through which the source/drain electrodes are in contact with the semiconductor layer. Thus, the electrodes are in contact with the semiconductor layer on its top. That is, when the channel protective layer 5 is formed on the oxide semiconductor layer 4 by the patterning of the silicon oxide film, at the same time, there are formed a plurality of contact holes 11 for penetrating through the silicon oxide film, on the oxide semiconductor layer 4. In this manner, the short channel length can possibly be made by the formation of the contact holes 11.

According to the above embodiments, in the display device using the oxide TFT, it is possible to realize the thin film transistor and the display device with a high aperture ratio and high reliability. With the oxide TFT with excellent driving capability, it is possible to realize a high definition liquid crystal display device in accordance with substantially the same processes and at substantially the same manufacturing cost as those for the amorphous Si-TFT, though the realization is not possible with the amorphous Si-TFT. In addition, with the oxide TFT, it is possible to realize a display device with a high aperture ratio and high reliability, with low power consumption.

The present invention described in the above embodiments may be applied in several modes of liquid crystal display devices. The several modes of liquid crystal display devices are an FFS (Fringe-Field-Switching) mode, an IPS (In-Plane-Switching) mode, a VA (Vertical-Alignment) mode, and a TN (Twisted-Nematic) mode. In the FFS mode, liquid crystal molecules are driven using a fringe electric field. In the IPS mode, liquid crystal molecules are rotated in the plane parallel to the substrate, and light is switched by a birefringence change. In the VA mode, a transmission state (white) and a non-transmission state are expressed. For this black and white expression, the liquid crystals are vertically aligned in an initial state, and a birefringence change is used. This change is caused by making the liquid crystals tilt upon application of a voltage thereto.

The present invention may also be applied to an organic EL (Organic-Electroluminescence) display device, which forms pixels using organic light-emitting diodes including organic compounds.

In the above embodiments, the descriptions have been made to the example of the liquid crystal display device as a disclosed example. However, other application examples may include any flat-panel type display devices, such as an organic EL display device, a self luminescence type display device, and an electronic paper type display device having electrophoretic elements. Needless to say, it is applicable without particular restriction in a range from the medium or small size to the large size.

What is claimed is:

1. A display device comprising:
   a gate electrode which is formed on a substrate;
   a gate insulating film which is formed to cover the gate electrode;
   an oxide semiconductor layer which is formed on the gate electrode via the gate insulating film;
   a protective layer which is in contact with a channel of the oxide semiconductor layer and formed on the oxide semiconductor layer; and
   source/drain electrodes which are electrically connected to the oxide semiconductor layer and formed to cover the oxide semiconductor layer,
   wherein a metal oxide layer is formed on the protective layer corresponding to the channel, and
   wherein the metal oxide layer has a thickness between 50 nm and 200 nm.

2. A display device comprising:
   a gate electrode which is formed on a substrate;
   a gate insulating film which is formed to cover the gate electrode;
   an oxide semiconductor layer which is formed on the gate electrode via the gate insulating film;
   an etching stopper layer which is formed of a silicon oxide film and formed to cover a channel of the oxide semiconductor layer; and
   source/drain electrodes which are electrically connected to the oxide semiconductor layer through a plurality of contact holes formed in the etching stopper layer, and are formed to cover the oxide semiconductor layer,
   wherein a metal oxide layer is formed on the etching stopper layer corresponding to the channel, and
   wherein the metal oxide layer has a thickness between 50 nm and 200 nm.

3. The display device according to claim 1, wherein the metal oxide layer is formed of any oxide of or alloy oxide in combination with titanium, molybdenum, aluminum, chromium, copper, tungsten, zirconium, tantalum, silver, and manganese.

4. The display device according to claim 2, wherein the metal oxide layer is formed of any oxide of or alloy oxide in combination with titanium, molybdenum, aluminum, chromium, copper, tungsten, zirconium, tantalum, silver, and manganese.

5. The display device according to claim 1, wherein the oxide semiconductor layer includes any of In—Ga—Zn—O, In—Al—Zn—O, In—Sn—Zn—O, In—Zn—O, In—Sn—O, Zn—O, and Sn—O, as a main component.

6. The display device according to claim 2, wherein the oxide semiconductor layer includes any of In—Ga—Zn—O, In—Al—Zn—O, In—Sn—Zn—O, In—Zn—O, In—Sn—O, Zn—O, and Sn—O, as a main component.

7. The display device according to claim 1, wherein the substrate is a glass substrate, and a silicon nitride film is formed between the substrate and the gate electrode in a manner that the substrate and the gate electrode are not in direct contact with each other.

8. The display device according to claim 2, wherein the substrate is a glass substrate, and a silicon nitride film is formed between the substrate and the gate electrode in a manner that the substrate and the gate electrode are not in direct contact with each other.

9. The display device according to claim 1, wherein the display device is a liquid crystal display device in an FFS (Fringe Field Switching) mode for driving liquid crystal molecules using a fringe electric field.

10. The display device according to claim 2, wherein the display device is a liquid crystal display device in an FFS (Fringe Field Switching) mode for driving liquid crystal molecules using a fringe electric field.

11. The display device according to claim 1, wherein the display device is an organic EL display device in which organic light-emitting diodes are used as light emitting devices.

12. The display device according to claim 2, wherein the display device is an organic EL display device in which organic light-emitting diodes are used as light emitting devices.

13. A display device comprising:
    a gate electrode which is formed on a substrate;
    a gate insulating film which is formed to cover the gate electrode;
    an oxide semiconductor layer which is formed on the gate electrode via the gate insulating film;
    a protective layer which is in contact with a channel of the oxide semiconductor layer and formed on the oxide semiconductor layer; and
    source/drain electrodes which are electrically connected to the oxide semiconductor layer and formed to cover the oxide semiconductor layer,
    wherein a metal oxide layer is formed on the protective layer corresponding to the channel, and
    wherein the metal oxide layer is a light shielding layer for shielding entrance of external light to the oxide semiconductor layer.

14. The display device according to claim 13, wherein the metal oxide layer is formed of any oxide of or alloy oxide in combination with titanium, molybdenum, aluminum, chromium, copper, tungsten, zirconium, tantalum, silver, and manganese.

15. The display device according to claim 13, wherein the oxide semiconductor layer includes any of In—Ga—Zn—O, In—Al—Zn—O, In—Sn—Zn—O, In—Zn—O, In—Sn—O, Zn—O, and Sn—O, as a main component.

16. The display device according to claim 13, wherein the substrate is a glass substrate, and a silicon nitride film is formed between the substrate and the gate electrode in a manner that the substrate and the gate electrode are not in direct contact with each other.

17. A display device comprising:
- a gate electrode which is formed on a substrate;
- a gate insulating film which is formed to cover the gate electrode;
- an oxide semiconductor layer which is formed on the gate electrode via the gate insulating film;
- an etching stopper layer which is formed of a silicon oxide film and formed to cover a channel of the oxide semiconductor layer; and
- source/drain electrodes which are electrically connected to the oxide semiconductor layer through a plurality of contact holes formed in the etching stopper layer, and are formed to cover the oxide semiconductor layer,
- wherein a metal oxide layer is formed on the etching stopper layer corresponding to the channel, and
- wherein the metal oxide layer is a light shielding layer for shielding entrance of external light to the oxide semiconductor layer.

18. The display device according to claim 17, wherein the metal oxide layer is formed of any oxide of or alloy oxide in combination with titanium, molybdenum, aluminum, chromium, copper, tungsten, zirconium, tantalum, silver, and manganese.

19. The display device according to claim 17, wherein the oxide semiconductor layer includes any of In—Ga—Zn—O, In—Al—Zn—O, In—Sn—Zn—O, In—Zn—O, In—Sn—O, Zn—O, and Sn—O, as a main component.

20. The display device according to claim 17, wherein the substrate is a glass substrate, and a silicon nitride film is formed between the substrate and the gate electrode in a manner that the substrate and the gate electrode are not in direct contact with each other.

* * * * *